United States Patent
Nirschl et al.

(10) Patent No.: US 7,551,476 B2
(45) Date of Patent: Jun. 23, 2009

(54) RESISTIVE MEMORY HAVING SHUNTED MEMORY CELLS

(75) Inventors: Thomas Nirschl, Essex Junction, VT (US); Thomas Happ, Tarrytown, NY (US); Jan Boris Philipp, Peekskill, NY (US)

(73) Assignees: Qimonda North America Corp., Cary, NC (US); Qimonda AG, Munich (DE)

( * ) Notice: Subject to any disclaimer, the term of this patent is extended or adjusted under 35 U.S.C. 154(b) by 276 days.

(21) Appl. No.: 11/541,973

(22) Filed: Oct. 2, 2006

(65) Prior Publication Data

US 2008/0080228 A1 Apr. 3, 2008

(51) Int. Cl.
*G11C 11/00* (2006.01)

(52) U.S. Cl. .............. 365/163; 365/148; 365/100; 257/2; 257/3; 257/5; 257/379

(58) Field of Classification Search .............. 365/163, 365/148, 100; 257/2, 3, 5, 379
See application file for complete search history.

(56) References Cited

U.S. PATENT DOCUMENTS

| | | | | |
|---|---|---|---|---|
| 2,876,436 A | * | 3/1959 | Anderson | ............ 365/145 |
| 4,668,906 A | * | 5/1987 | Ekstrand | ............ 323/297 |
| 5,418,738 A | * | 5/1995 | Abadeer et al. | ............ 365/100 |
| 6,937,507 B2 | | 8/2005 | Chen | |
| 7,248,494 B2 | * | 7/2007 | Oh et al. | ............ 365/148 |
| 2004/0095802 A1 | * | 5/2004 | Tran | ............ 365/158 |
| 2004/0113135 A1 | | 6/2004 | Wicker | |
| 2005/0017760 A1 | * | 1/2005 | Grasso et al. | ............ 327/50 |
| 2006/0091374 A1 | * | 5/2006 | Yoon et al. | ............ 257/2 |
| 2007/0047160 A1 | * | 3/2007 | Philipp et al. | ............ 361/18 |
| 2007/0047296 A1 | * | 3/2007 | Philipp et al. | ............ 365/163 |
| 2007/0133270 A1 | * | 6/2007 | Jeong et al. | ............ 365/163 |
| 2007/0153569 A1 | * | 7/2007 | Nirschl et al. | ............ 365/163 |
| 2007/0201267 A1 | * | 8/2007 | Happ et al. | ............ 365/163 |
| 2008/0068878 A1 | * | 3/2008 | Nirschl et al. | ............ 365/163 |
| 2008/0117669 A1 | * | 5/2008 | Fuji et al. | ............ 365/163 |

* cited by examiner

*Primary Examiner*—Pho M. Luu
*Assistant Examiner*—Eric Wendler
(74) *Attorney, Agent, or Firm*—Dicke, Billig & Czaja, PLLC

(57) ABSTRACT

A memory includes a bit line and a plurality of resistive memory cells coupled to the bit line. Each resistive memory cell is programmable to each of at least three resistance states. The memory includes a first resistor for selectively coupling to the bit line to form a first current divider with a selected memory cell during a read operation.

24 Claims, 8 Drawing Sheets

RESISTIVE MEMORY HAVING SHUNTED MEMORY CELLS

CROSS-REFERENCE TO RELATED APPLICATIONS

This Utility patent application is related to U.S. patent application Ser. No. 11/521,527, entitled "RESISTIVE MEMORY HAVING SHUNTED MEMORY CELLS," filed Sep. 14, 2006, and which is incorporated herein by reference.

BACKGROUND

One type of memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself, or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states. Cells in such intermediate states have a resistance that lies between the fully crystalline state and the fully amorphous state. If the phase change memory cell is programmed to one of three different resistance levels, 1.5 bits of data per cell can be stored. If the phase change memory cell is programmed to one of four different resistance levels, two bits of data per cell can be stored, and so on. For simplicity, the description in this disclosure is substantially focused on four different resistance levels or states and two bits of data per cell. This is for illustrative purposes only, however, and not intended to limit the scope of the invention. In principle it is possible to store three or more states.

Typically, there is a wide distribution of resistance values of a phase change memory cell in the two or more resistance states. The time to read the value of a phase change memory cell may be significantly long due to the high resistance of the amorphous state or intermediate states of the phase change material. This significantly long read time leads to slow overall memory operation. In addition, significant heating of phase change material during a read operation may lead to a change in the resistance value of the phase change material. This change in the resistance value of the phase change material during a read operation is termed read disturb.

For these and other reasons, there is a need for the present invention.

SUMMARY

One embodiment of the present invention provides a memory. The memory includes a bit line and a plurality of resistive memory cells coupled to the bit line. Each resistive memory cell is programmable to each of at least three resistance states. The memory includes a first resistor for selectively coupling to the bit line to form a first current divider with a selected memory cell during a read operation.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
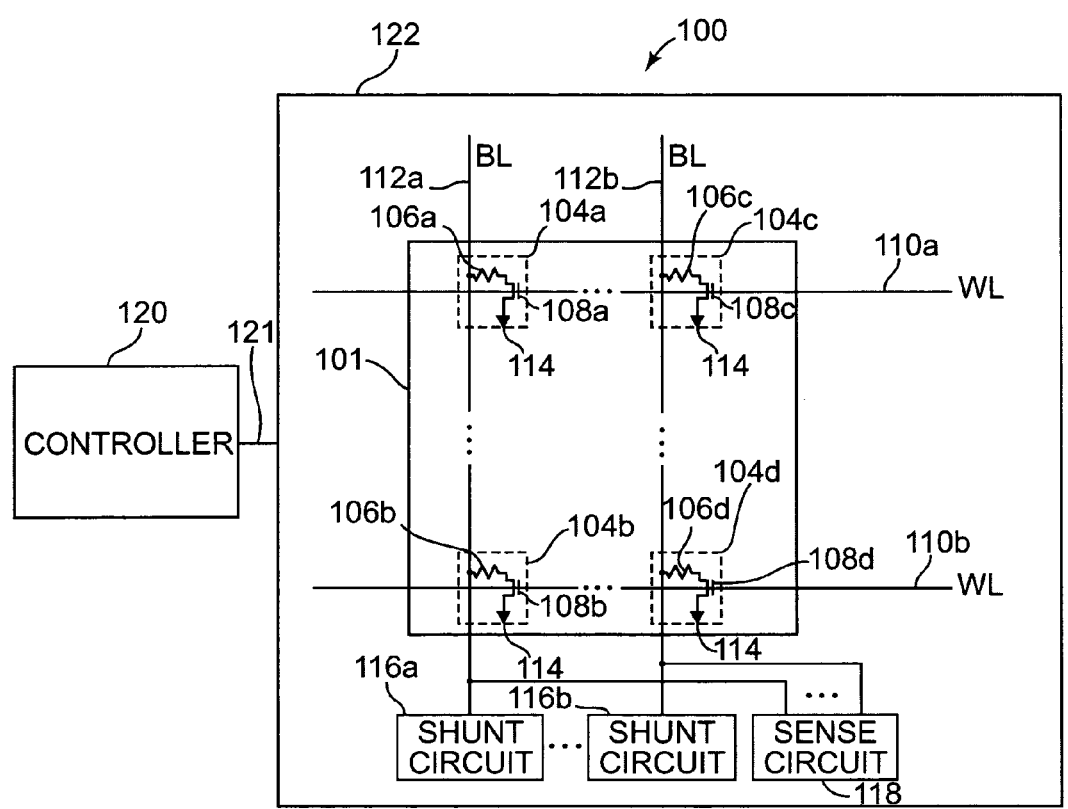
FIG. 1 is a diagram illustrating one embodiment of a memory device.

FIG. 1 is a diagram illustrating one embodiment of a memory device 100. Memory device 100 includes a controller 120 and a memory circuit 122. Memory circuit 122 includes an array of phase change memory cells 101, a plurality of shunt circuits 116a-116b (collectively referred to as shunt circuits 116), and a sense circuit 118. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

Each of phase change memory cells 104a-104d stores data based on the amorphous and crystalline states of phase change material in the memory cell. Also, each of the memory cells 104a-104d can be programmed into more than two states by programming the phase change material to have intermediate resistance values. To program one of the memory cells 104a-104d to an intermediate resistance value, the amount of crystalline material coexisting with amorphous material, and hence the cell resistance, is controlled via a suitable write strategy.

Shunt circuits 116a-116b shunt a portion of the current applied to selected memory cells during read operations to prevent read disturb in the selected memory cells. Each shunt circuit 116a-116b includes at least one shunt resistor and at least one switch for selectively electrically coupling the shunt resistor to the associated bit line. The number of shunt resistors is based on the number of bits each memory cell stores and the method used for reading the resistance value of each memory cell. In one embodiment, the number of shunt resistors is less than the number of resistance levels that can be stored by a memory cell.

In one embodiment, each memory cell stores two bits and three shunt resistors are used in combination with an up to three step process to determine the resistance value of each memory cell. In another embodiment, each memory cell stores two bits and one shunt resistor is used in combination with a two step process to determine the resistance value of each memory cell. In other embodiments, each memory cell stores any suitable number of bits and a suitable number of shunt resistors are used in combination with the selected process to determine the resistance value of each memory cell.

As used herein, the term "electrically coupled" is not meant to mean that the elements must be directly coupled together and intervening elements may be provided between the "electrically coupled" elements.

Controller 120 is electrically coupled to memory circuit 122 through signal path 121. Controller 120 includes a microprocessor, microcontroller, or other suitable logic circuitry for controlling the operation of memory circuit 122. Controller 120 controls read and write operations of memory circuit 122 including the application of control signals to array of phase change memory cells 101, shunt circuits 116a-116b, and sense circuit 118.

Each phase change memory cell 104 is electrically coupled to a word line 110, a bit line 112, and common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114. Each bit line 112 is electrically coupled to a shunt circuit 116. Bit line 112a is electrically coupled to shunt circuit 116a and sense circuit 118. Bit line 112b is electrically coupled to shunt circuit 116b and sense circuit 118.

Each phase change memory cell 104 includes at least one phase change element 106 and at least one transistor 108. While transistor 108 is a field-effect transistor (FET) in the illustrated embodiment, in other embodiments, transistor 108 can be other suitable devices such as a bipolar transistor or a 3D transistor structure. In other embodiments, a diode-like structure may be used in place of transistor 108. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b, and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b, and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b. In another embodiment, each phase change element 106 is electrically coupled to common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines more than two states for storing data within memory device 100. In the amorphous state, a phase change material exhibits significantly higher resistivity than in the crystalline state. Therefore, the more than two states of phase change elements 106a-106d differ in their electrical resistivity. In one embodiment, the more than two states can be three states and a ternary system can be used, wherein the three states are assigned bit values of "0", "1", and "2". In one embodiment, the more than two states are four states that can be assigned multi-bit values, such as "00", "01", "10", and "11". In other embodiments, the more than two states can be any suitable number of states in the phase change material of a phase change element.

Shunt circuit 116a selectively shunts current from memory cells 104a-104b on bit line 112a, and shunt circuit 116b selectively shunts current from memory cells 104c-104d on bit line 112b. In one embodiment, each shunt circuit 116a-116b includes a number of shunt resistors equal to the number of resistance states of each memory cell minus one. For example, if each memory cell stores four states (two data bits), each shunt circuit 116a-116b includes three shunt resistors. In another embodiment, each shunt circuit 116a-116b includes a number of shunt resistors based on the following process:

1) A=the number of resistance states for each memory cell; B=0
2) if A>2, then A=A/2, B=B+1, and repeat step 2;
3) if A≦2, then stop, B equals the number of shunt resistors. For example, if each memory cell stores four states (two data bits), each shunt circuit 116a-116b includes one shunt resistor. If each memory cell stores eight states (three data bits), each shunt circuit 116a-116b includes two shunt resistors. If each memory cell stores 16 states (four data bits), each shunt circuit 116a-116b includes three shunt resistors.

Sense circuit 118 reads the states of memory cells 104a-104d through bit lines 112a-112b based on the current through shunt circuits 116a-116b. In one embodiment, to read the resistance of one of the memory cells 104a-104d sense circuit 118 provides current that flows through one of the memory cells 104a-104d and one of shunt circuits 116a-116b through a bit line 112a-112b and sense circuit 118 reads the voltage across that one of the memory cells 106a-106b and shunt circuits 116a-116b. With a selected memory cell 104a-104d in a crystalline state or a partially crystalline and partially amorphous state, sense circuit 118 senses a lower voltage than with the selected memory cell in an amorphous state or a partially amorphous and partially crystalline state.

During a set operation of phase change memory cell 104a, a set current or voltage pulse is selectively enabled and sent through bit line 112a to phase change element 106a thereby heating it above its crystallization temperature (but usually below its melting temperature) with word line 110a selected to activate transistor 108a. In this way, phase change element 106a reaches its crystalline state or a partially crystalline and partially amorphous state during this set operation. During a reset operation of phase change memory cell 104a, a reset current or voltage pulse is selectively enabled and sent through bit line 112a to phase change element 106a. The reset current or voltage quickly heats phase change element 106a above its melting temperature. After the current or voltage pulse is turned off, the phase change element 106a quickly quench cools into the amorphous state or a partially amorphous and partially crystalline state. Phase change memory cells 104b-104d and other phase change memory cells 104 in memory array 100 are set and reset similarly to phase change memory cell 104a using a similar current or voltage pulse.

Figure 2:
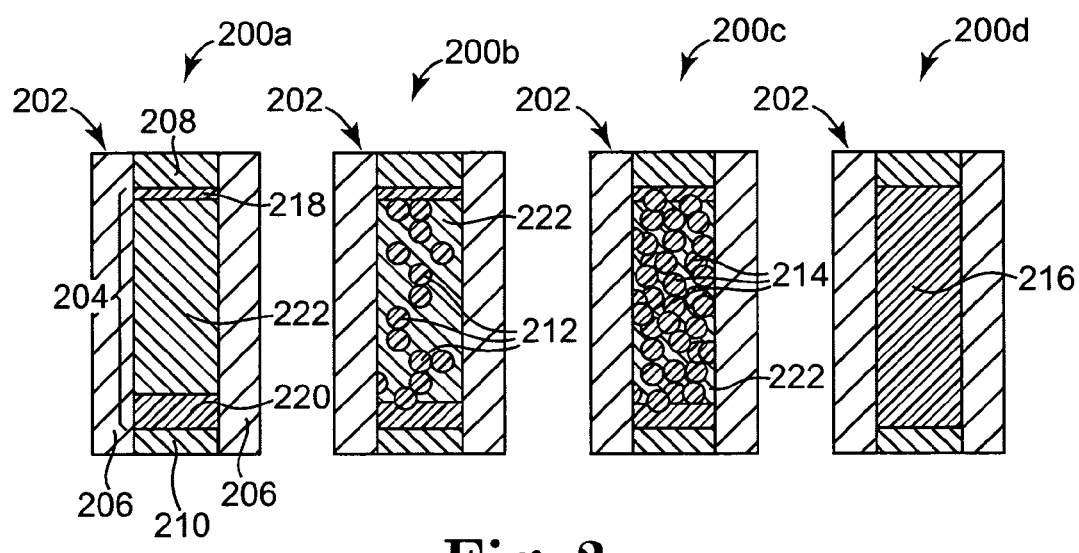
FIG. 2 is a diagram illustrating one embodiment of a memory element in four different states.

FIG. 2 is a diagram illustrating one embodiment of a phase change element 202 in four different states at 200a, 200b, 200c, and 200d. Phase change element 202 includes a phase change material 204 that is laterally surrounded by insulation material 206. In other embodiments, phase change element 202 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to phase change element 202 via first electrode 208 and second electrode 210. The current path through phase change material 204 is from one of the first electrode 208 and second electrode 210 to the other one of the first electrode 208 and second electrode 210. In one embodiment, each of the phase change elements 106a-106d is similar to phase change element 202. Phase change element 202 provides a storage location for storing bits of data.

Insulation material 206 can be any suitable insulator, such as $SiO_2$, $SiO_x$, SiN, fluorinated silica glass (FSG), boro-phosphorous silicate glass (BPSG), boro-silicate glass (BSG), or low-k material. First electrode 208 and second electrode 210 can be any suitable electrode material, such as TiN, TaN, W, Al, Ti, Ta, TiSiN, TaSiN, TiAlN, TaAlN, or Cu.

Phase change material 204 may be made up of a variety of materials in accordance with the present invention. Generally, chalcogenide alloys that contain one or more elements from group VI of the periodic table are useful as such materials. In one embodiment, phase change material 204 of phase change element 202 is made up of a chalcogenide compound material, such as GeSbTe, SbTe, GeTe, or AgInSbTe. In another embodiment, phase change material 204 is chalcogen free, such as GeSb, GaSb, InSb, or GeGaInSb. In other embodiments, phase change material 204 is made up of any suitable material including one or more of the elements Ge, Sb, Te, Ga, As, In, Se, and S.

Phase change material 204 is programmed into one of four states to store two bits of data. A selection device, such as a transistor 108, is electrically coupled to first electrode 208 to control the application of pulses to phase change material 204. The pulses reset phase change material 204 and program one of the other three states into phase change material 204. At 200b, a small fraction 212 of phase change material 204 has been programmed to change the resistance through phase change material 204 and phase change element 202. At 200c, a medium sized fraction 214 of phase change material 204 has been programmed to change the resistance through phase change material 204 and phase change element 202. At 200d, a large fraction 216, which is substantially all of phase change material 204, has been programmed to change the resistance through phase change material 204 and phase change element 202.

The size of the programmed fraction is related to the resistance through phase change material 204 and phase change element 202. The three different phase change fractions at 200b-200d plus the initial state at 200a provide four states in phase change material 204, and phase change element 202 provides a storage location for storing two bits of data. In one embodiment, the state of phase change element 202 at 200a is a "00", the state of phase change element 202 at 200b is a "01", the state of phase change element 202 at 200c is a "10", and the state of phase change element 202 at 200d is a "11".

At 200a, phase change material 204 is reset to a substantially amorphous state. During a reset operation of phase change element 202, a reset pulse is selectively enabled by the selection device and sent through first electrode 208 and phase change material 204. The reset pulse heats phase change material 204 above its melting temperature and phase change material 204 is quickly cooled to achieve the substantially amorphous state at 200a. After a reset operation, phase change material 204 includes crystalline state phase change material at 218 and 220, and amorphous state phase change material at 222. The substantially amorphous state at 200a is the highest resistance state of phase change element 202.

To program phase change material 204 into one of the other three states 200b-200d, a write pulse is provided via a write circuit, such as controller 120. At 200b, a write pulse is provided to program the small volume fraction 212 into a crystalline state. The crystalline state is less resistive than the amorphous state and phase change element 202 at 200b has a lower resistance than phase change element 202 in the substantially amorphous state at 200a. The partially crystalline and partially amorphous state at 200b is the second highest resistance state of phase change element 202.

At 200c, a write pulse is provided to program the medium volume fraction 214 into a crystalline state. Since the crystalline fraction 214 is larger than the crystalline faction 212 and the crystalline state is less resistive than the amorphous state, phase change element 202 at 200c has a lower resistance than phase change element 202 at 200b and phase change element 202 in the amorphous state at 200a. The partially crystalline and partially amorphous state at 200c is the second lowest resistance state of phase change element 202.

At 200d, a write pulse is provided to program substantially all of the phase change material 216 into the crystalline state. Since the crystalline state is less resistive than the amorphous state, phase change element 202 at 200d has a lower resistance than phase change element 202 at 200c, phase change element 202 at 200b, and phase change element 202 in the amorphous state at 200a. The substantially crystalline state at 200d is the lowest resistance state of phase change element 202. In other embodiments, phase change element 202 can be programmed into any suitable number of resistance values or states. In other embodiments, phase change element 202 can be set to a substantially crystalline state and reset pulses can be used to program phase change element 202 to the desired resistance value or state.

Figure 3:
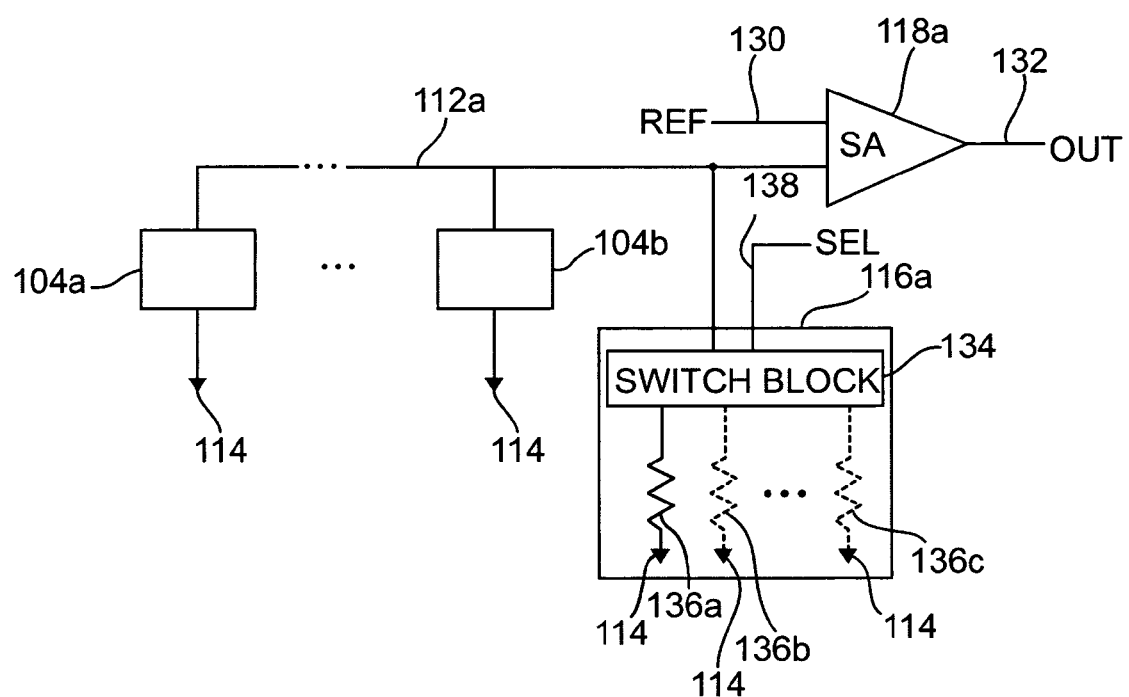
FIG. 3 is a diagram illustrating one embodiment of a single bit line, a shunt circuit, and a sense amplifier in the memory device.

FIG. 3 is a diagram illustrating one embodiment of a single bit line 112a, shunt circuit 116a, and a sense amplifier (SA) 118a in memory device 100. Shunt circuit 116a includes switch block 134 and shunt resistors 136a-136(n), where "n" is based on the number of resistance states of the phase change memory cells and the method used to read the resistance states. In one embodiment, shunt circuit 116a includes only one shunt resistor 136a. In one embodiment, sense amplifier 118a is electrically coupled to multiple bit lines 112 through a multiplexing circuit. In one embodiment, switch block 134 is electrically coupled to multiple bit lines 112 through a multiplexing circuit.

One side of each phase change memory cell 104a-104b is electrically coupled to a first input of sense amplifier 118a and a first input of switch block 134 of shunt circuit 116a through bit line 112a. A second input of switch block 134 receives a select (SEL) signal on SEL signal path 138. Each output of switch block 134 is electrically coupled to one side of a shunt resistor 136a-136(n). The other side of each phase change memory cell 104a-104b and the other side of each shunt resistor 136a-136(n) are electrically coupled to common or ground 114.

A second input of sense amplifier 118a receives a reference (REF) signal on REF signal path 130. The output of sense amplifier 118a provides the output (OUT) signal on OUT signal path 132. Sense amplifier 118a is part of sense circuit 118. In one embodiment, the REF signal on REF signal path 130 and the SEL signal on SEL signal path 138 are supplied by controller 120, and the OUT signal on OUT signal path 132 is supplied to controller 120.

Switch block 134 includes transmission gates, transistors, or other suitable switches. Switch block 134 is controlled by the SEL signal to selectively couple bit line 112a to a selected shunt resistor 136a-136(n) to pass signals between bit line 112a and the selected shunt resistor 136a-136(n). Switch block 124 may be controlled by the SEL signal to block signals from passing between bit line 112a and a shunt resistor 136a-136(n). In one embodiment, shunt resistors 136a-136(n) include linear resistors. In other embodiments, shunt resistors 136a-136(n) include active devices configured to act as resistors.

Sense amplifier 118a receives the REF signal on REF signal path 130 and the signal on bit line 112a to provide the OUT signal on OUT signal path 132. In one embodiment, the REF signal is a current signal. In another embodiment, the REF signal is a voltage signal. In response to the signal on bit line 112a having a value greater than the REF signal, sense amplifier 118a outputs a logic high OUT signal on OUT signal path 132. In response to the signal on bit line 112a having a value less than the REF signal, sense amplifier 118a output a logic low OUT signal on OUT signal path 132. In other embodiments, the logic levels of the OUT signal on OUT signal path 132 are reversed.

During a read operation and with switch block 134 coupling bit line 112a to a selected shunt resistor 136a-136(n), a current is applied to bit line 112a and a memory cell 104a-104b is selected. The current is divided between the selected memory cell 104 and the selected shunt resistor 136 based on the state of the phase change element within the selected memory cell. Sense amplifier 118a compares the REF signal to the signal on bit line 112a to provide the OUT signal indicating the state of the selected memory cell. In one embodiment, if the voltage across the selected shunt resistor 136 is greater than a voltage on REF signal path 130, sense amplifier 118a outputs a logic high OUT signal on OUT signal path 132 indicating the selected memory cell is programmed to a resistance state greater than the resistance of the selected shunt resistor 136. In response to the voltage across the selected shunt resistor 136 being less than the voltage on REF signal path 130, sense amplifier 118a outputs a logic low OUT signal on OUT signal path 132 indicating the selected memory cell is programmed to a resistance state less than the resistance of the selected shunt resistor 136. By selectively shunting the current from memory cells 104a-104b during a read operation, thus limiting the current through the memory cells, read disturb of the memory cells is prevented.

Figure 4A:
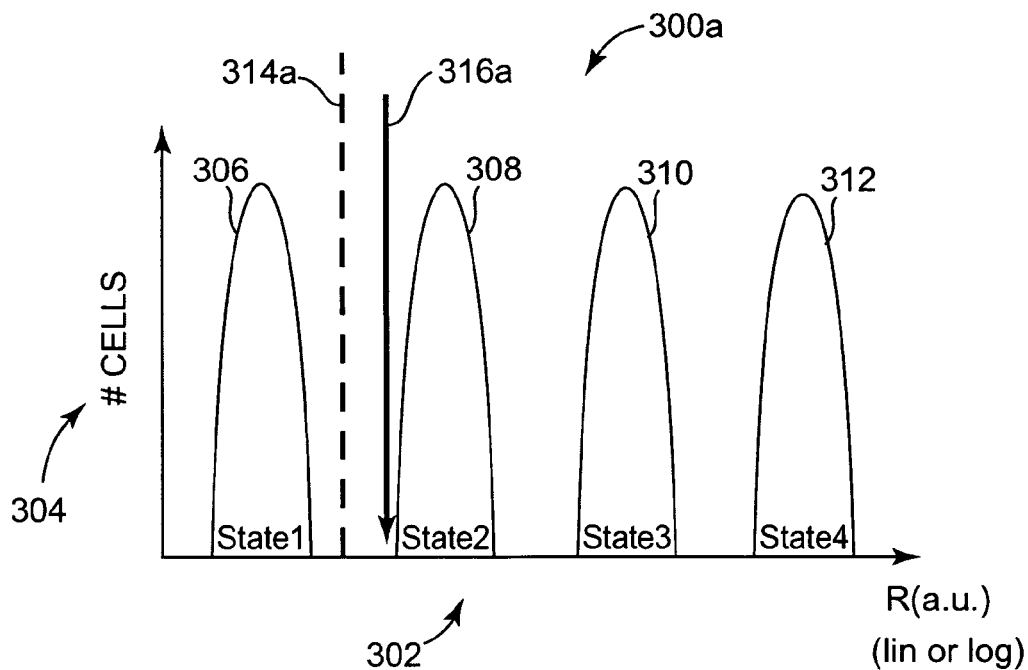
FIG. 4A is a chart illustrating one embodiment of resistance distributions for memory cells and a first sensing level for a read operation.
Figure 4B:
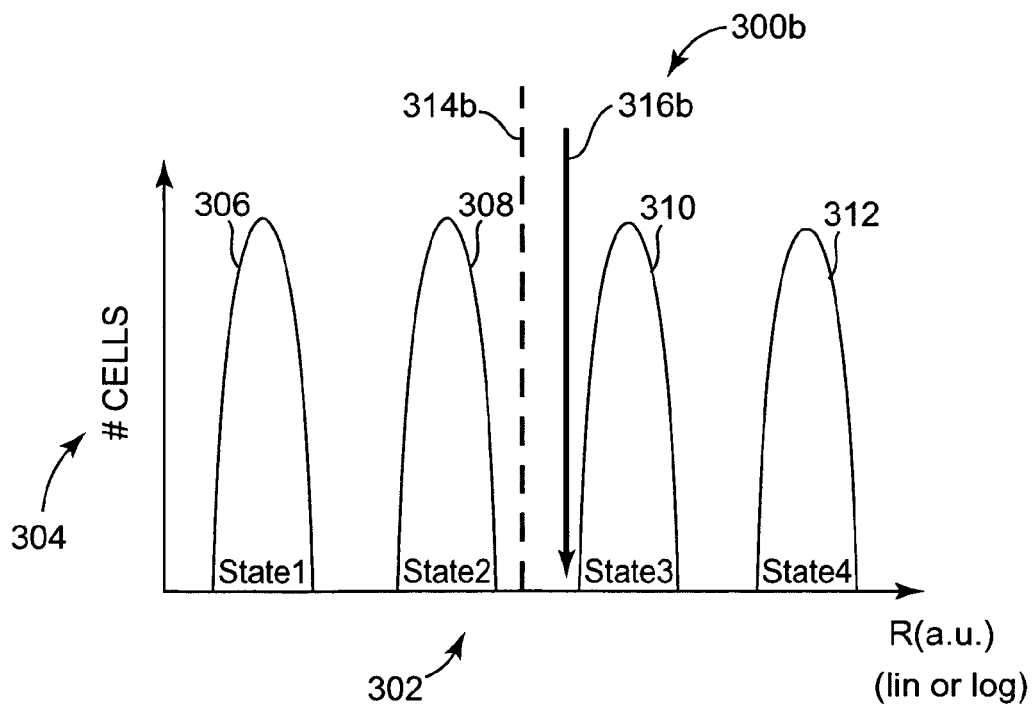
FIG. 4B is a chart illustrating one embodiment of resistance distributions for memory cells and a second sensing level for a read operation.
Figure 4C:
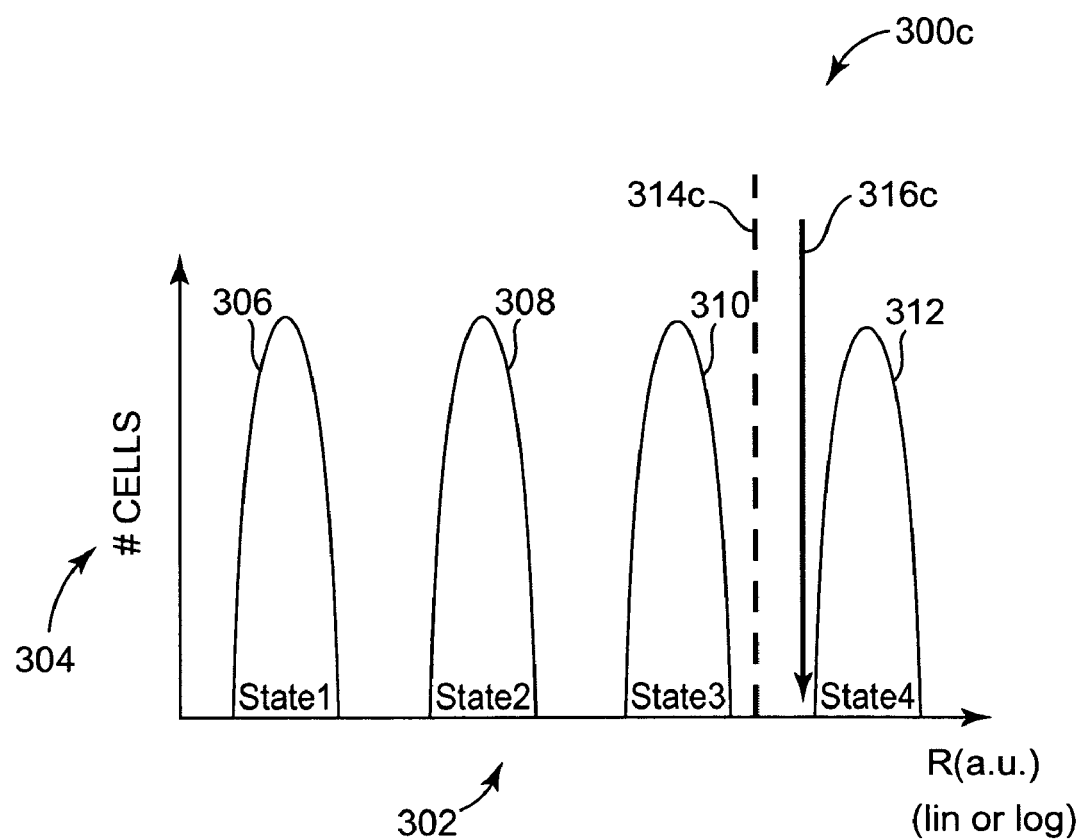
FIG. 4C is a chart illustrating one embodiment of resistance distributions for memory cells and a third sensing level for a read operation.
Figure 5:
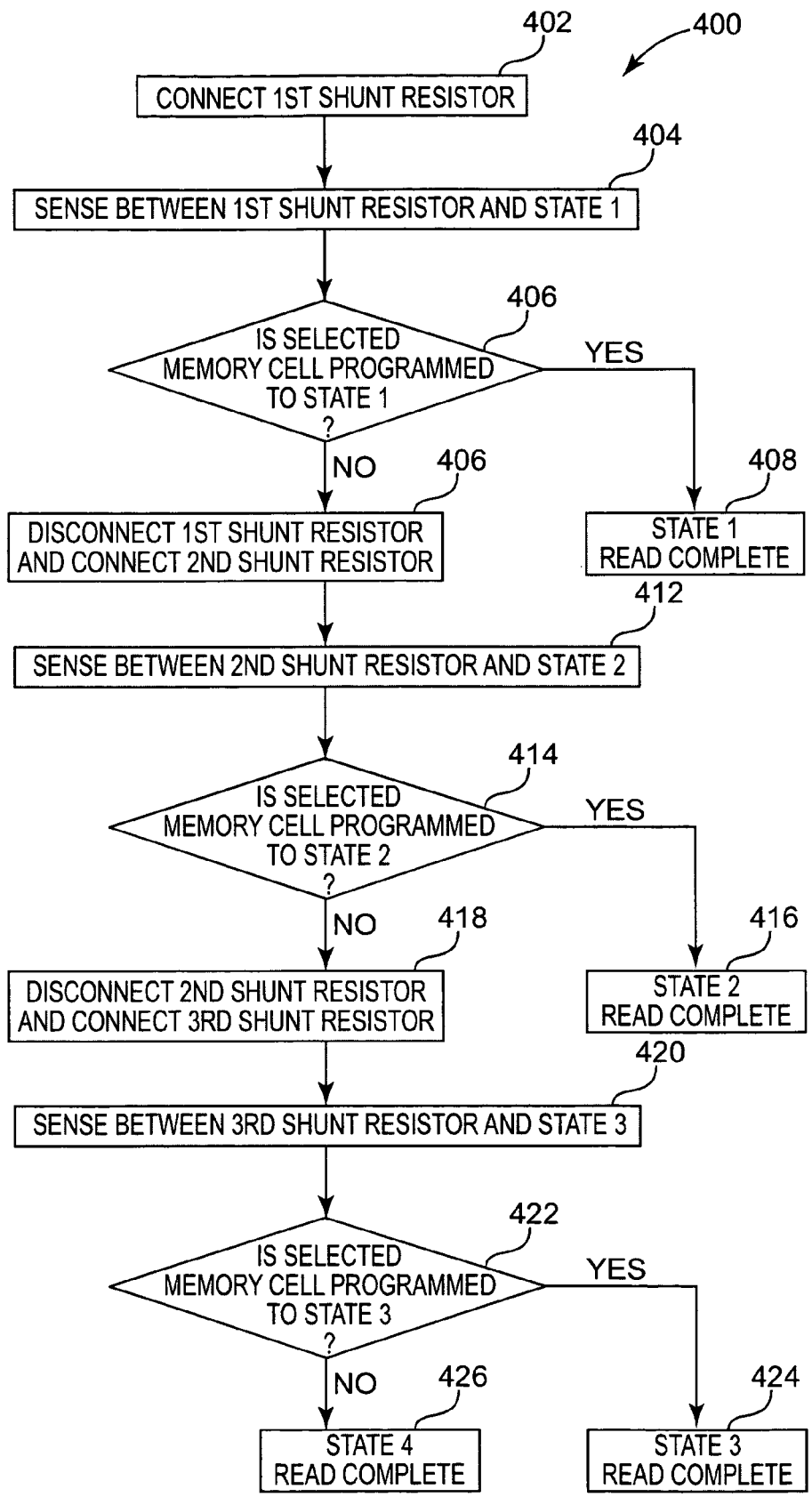
FIG. 5 is a flow diagram illustrating one embodiment of a method for reading the resistance state of a memory cell.

The following FIGS. 4A-5 illustrate one embodiment of a method for sensing the resistance state of a selected memory cell, such as memory cell 104a. The method uses shunt circuits 116 including a number of shunt resistors 136 equal to the number of possible resistance states for the memory cells minus one. In this embodiment, each memory cell is programmed to one of four resistance states and each shunt circuit includes three shunt resistors. In other embodiments, each memory cell can be programmed to any suitable number of resistance states and each shunt circuit includes the suitable number of shunt resistors for determining the resistance state of each memory cell.

FIG. 4A is a chart 300a illustrating one embodiment of resistance distributions for memory cells and a first sensing level for a read operation. Chart 300a includes resistance on x-axis 302 in either a linear or log scale and the number of cells on y-axis 304. The resistance distribution for phase change memory cells programmed to a first resistance state, such as state 200d illustrated in FIG. 2, is indicated at 306. The resistance distribution for phase change memory cells programmed to a second resistance state, such as state 200c illustrated in FIG. 2, is indicated at 308. The resistance distribution for phase change memory cells programmed to a third resistance state, such as state 200b illustrated in FIG. 2, is indicated at 310. The resistance distribution for phase change memory cells programmed to a fourth resistance state, such as state 200a illustrated in FIG. 2, is indicated at 312.

In this embodiment of a read operation, the REF signal on REF signal path 130 (FIG. 3) is set at a value representing the resistance indicated at 314a between resistance distribution 306 and resistance distribution 308. A shunt resistor, such as shunt resistor 136a is selected to provide the resistance indicated at 316a, which is greater than the resistance value at 314a represented by the REF signal and less than the lowest value of resistance distribution 308. Therefore, phase change elements having a resistance value above the shunt resistor value at 316a are protected from read disturb.

In response to a read signal, sense amplifier 118a (FIG. 3) compares the REF signal value 314a to the signal on bit line 112a to provide the OUT signal indicating whether the selected memory cell is programmed to the first resistance state or to a resistance state greater than the first resistance state. In one embodiment, if the voltage across the selected shunt resistor 136 is greater than the voltage on REF signal path 130, sense amplifier 118a outputs a logic high OUT signal on OUT signal path 132 indicating the selected memory cell is programmed to a resistance state greater than the first resistance state. In response to the voltage across the selected shunt resistor 136 being less than the voltage on REF signal path 130, sense amplifier 118a outputs a logic low OUT signal on OUT signal path 132 indicating the selected memory cell is programmed to the first resistance state. If the selected memory cell is programmed to the first resistance state, the read operation is complete. If the selected memory cell is programmed to a resistance state greater than the first resistance state, the read operation continues as illustrated in FIG. 4B.

FIG. 4B is a chart 300b illustrating one embodiment of resistance distributions for memory cells and a second sensing level for a read operation. Chart 300b is similar to chart 300a previously described and illustrated with reference to FIG. 4A, except that in chart 300b the REF signal on REF signal path 130 (FIG. 3) is set at a value representing the resistance indicated at 314b between resistance distribution 308 and resistance distribution 310. A shunt resistor, such as shunt resistor 136b is selected to provide the resistance indicated at 316b, which is greater than the resistance value at 314b represented by the REF signal and less than the lowest value of resistance distribution 310. Therefore, phase change elements having a resistance value above the shunt resistor value at 316b are protected from read disturb.

In response to a read signal, sense amplifier 118a (FIG. 3) compares the REF signal value 314b to the signal on bit line 112a to provide the OUT signal indicating whether the selected memory cell is programmed to the second resistance state or to a resistance state greater than the second resistance state. In one embodiment, if the voltage across the selected shunt resistor 136 is greater than a voltage on REF signal path 130, sense amplifier 118a outputs a logic high OUT signal on OUT signal path 132 indicating the selected memory cell is programmed to a resistance state greater than the second resistance state. In response to the voltage across the selected shunt resistor 136 being less than the voltage on REF signal path 130, sense amplifier 118a outputs a logic low OUT signal on OUT signal path 132 indicating the selected memory cell is programmed to the second resistance state. If the selected memory cell is programmed to the second resistance state, the read operation is complete. If the selected memory cell is programmed to a resistance state greater than the second resistance state, the read operation continues as illustrated in FIG. 4C.

FIG. 4C is a chart 300c illustrating one embodiment of resistance distributions for memory cells and a third sensing level for a read operation. Chart 300c is similar to chart 300a previously described and illustrated with reference to FIG. 4A, except that in chart 300c the REF signal on REF signal path 130 (FIG. 3) is set at a value representing the resistance indicated at 314c between resistance distribution 310 and resistance distribution 312. A shunt resistor, such as shunt resistor 136(n) is selected to provide the resistance indicated at 316c, which is greater than the resistance value represented by the REF signal at 314c and less than the lowest value of resistance distribution 312. Therefore, phase change elements having a resistance value above the shunt resistor value at 316c are protected from read disturb.

In response to a read signal, sense amplifier 118a (FIG. 3) compares the REF signal value 314c to the signal on bit line 112a to provide the OUT signal indicating whether the selected memory cell is programmed to the third resistance state or to the fourth resistance state. In one embodiment, if the voltage across the selected shunt resistor 136 is greater than a voltage on REF signal path 130, sense amplifier 118a outputs a logic high OUT signal on OUT signal path 132 indicating the selected memory cell is programmed to the fourth resistance state. In response to the voltage across the selected shunt resistor 136 being less than the voltage on REF signal path 130, sense amplifier 118a outputs a logic low OUT signal on OUT signal path 132 indicating the selected memory cell is programmed to the third resistance state. The read operation for the selected phase change memory cell is then complete.

FIG. 5 is a flow diagram illustrating one embodiment of a method 400 for reading a selected phase change memory cell. At 402, a first shunt resistor such as a resistor having a resistance value as indicated at 316a in FIG. 4A is selectively coupled to the bit line of the selected memory cell. The first shunt resistor limits the current that can flow through the selected memory cell in response to a read signal. At 404, in response to a read signal, a signal indicating the resistance state of the selected memory cell is sensed. At 406, the signal indicating the resistance state of the selected memory cell is compared to a first reference value, such as reference value 314a illustrated in FIG. 4A. If the signal indicating the resistance state of the selected memory cell is less than the reference value, the selected memory cell is determined to be programmed to the first resistance state and the read operation is complete as indicated at 408.

If the signal indicating the resistance state of the selected memory cell is greater than or equal to the reference value, the selected memory cell is determined to be programmed to a resistance state greater than the first resistance state. In this case, at 410, the first shunt resistor is disconnected and a second shunt resistor such as a resistor having a resistance value as indicated at 316b in FIG. 4B is selectively coupled to the bit line of the selected memory cell. The second shunt resistor limits the current that can flow through the selected memory cell in response to a read signal.

At 412, in response to a read signal, a signal indicating the resistance state of the selected memory cell is sensed. At 414, the signal indicating the resistance state of the selected memory cell is compared to a second reference value, such as reference value 314b illustrated in FIG. 4B. If the signal indicating the resistance state of the selected memory cell is less than the reference value, the selected memory cell is determined to be programmed to the second resistance state and the read operation is complete as indicated at 416.

If the signal indicating the resistance state of the selected memory cell is greater than or equal to the reference value, the selected memory cell is determined to be programmed to a resistance state greater than the second resistance state. In this case, at 418, the second shunt resistor is disconnected and a third shunt resistor such as a resistor having a resistance value as indicated at 316c in FIG. 4C is selectively coupled to the bit line of the selected memory cell. The third shunt resistor limits the current that can flow through the selected memory cell in response to a read signal.

At 420, in response to a read signal, a signal indicating the resistance state of the selected memory cell is sensed. At 422, the signal indicating the resistance state of the selected memory cell is compared to a third reference value, such as reference value 314c illustrated in FIG. 4C. If the signal indicating the resistance state of the selected memory cell is less than the reference value, the selected memory cell is determined to be programmed to the third resistance state and the read operation is complete as indicated at 424. If the signal indicating the resistance state of the selected memory cell is greater than or equal to the reference value, the selected memory cell is determined to be programmed to the fourth resistance state and the read operation is complete as indicated at 426. Method 400, while illustrated with reference to a memory cell storing two data bits, can be expanded for reading memory cells storing three or more data bits.

Figure 6A:
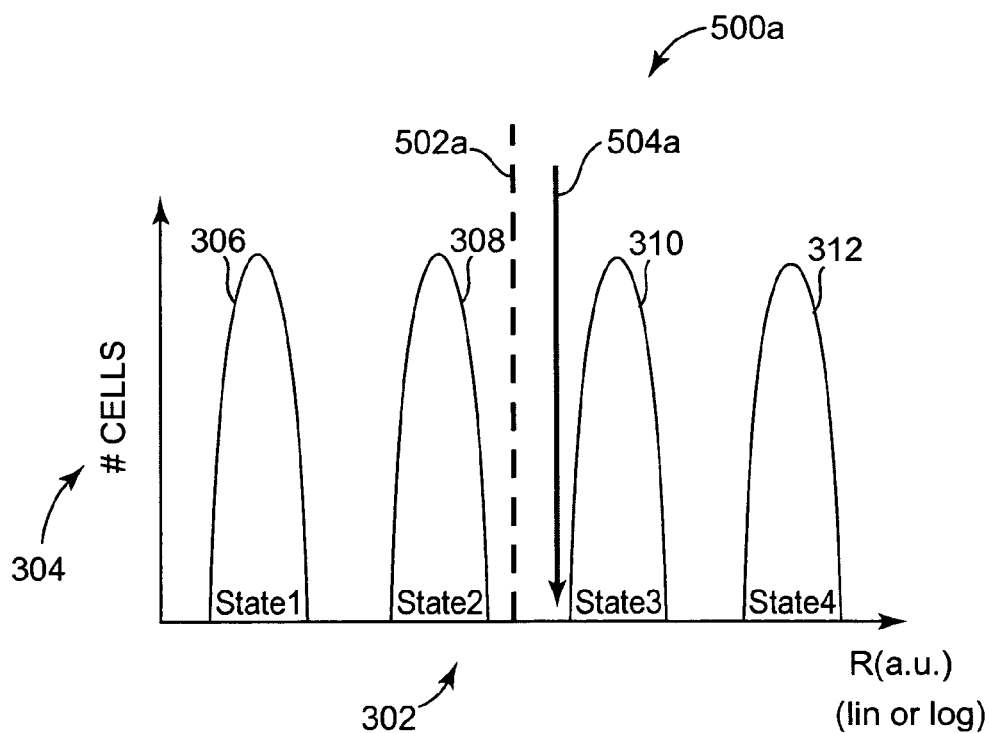
FIG. 6A is a chart illustrating one embodiment of resistance distributions for memory cells and a first sensing level for a read operation.
Figure 6B:
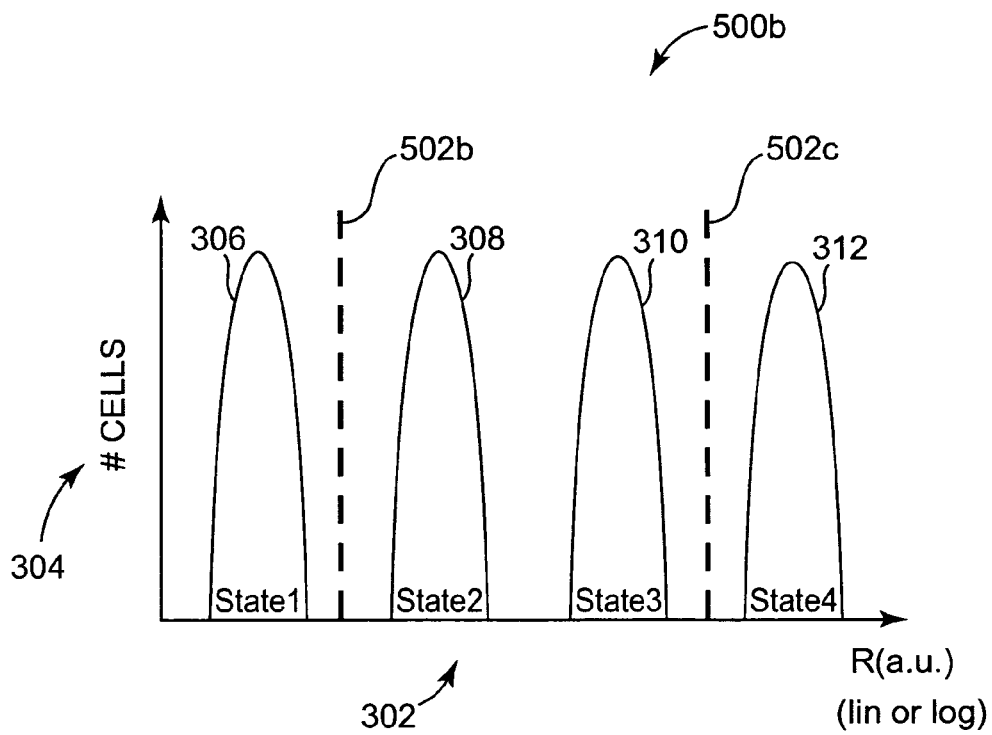
FIG. 6B is a chart illustrating one embodiment of resistance distributions for memory cells and second sensing levels for a read operation.
Figure 7:
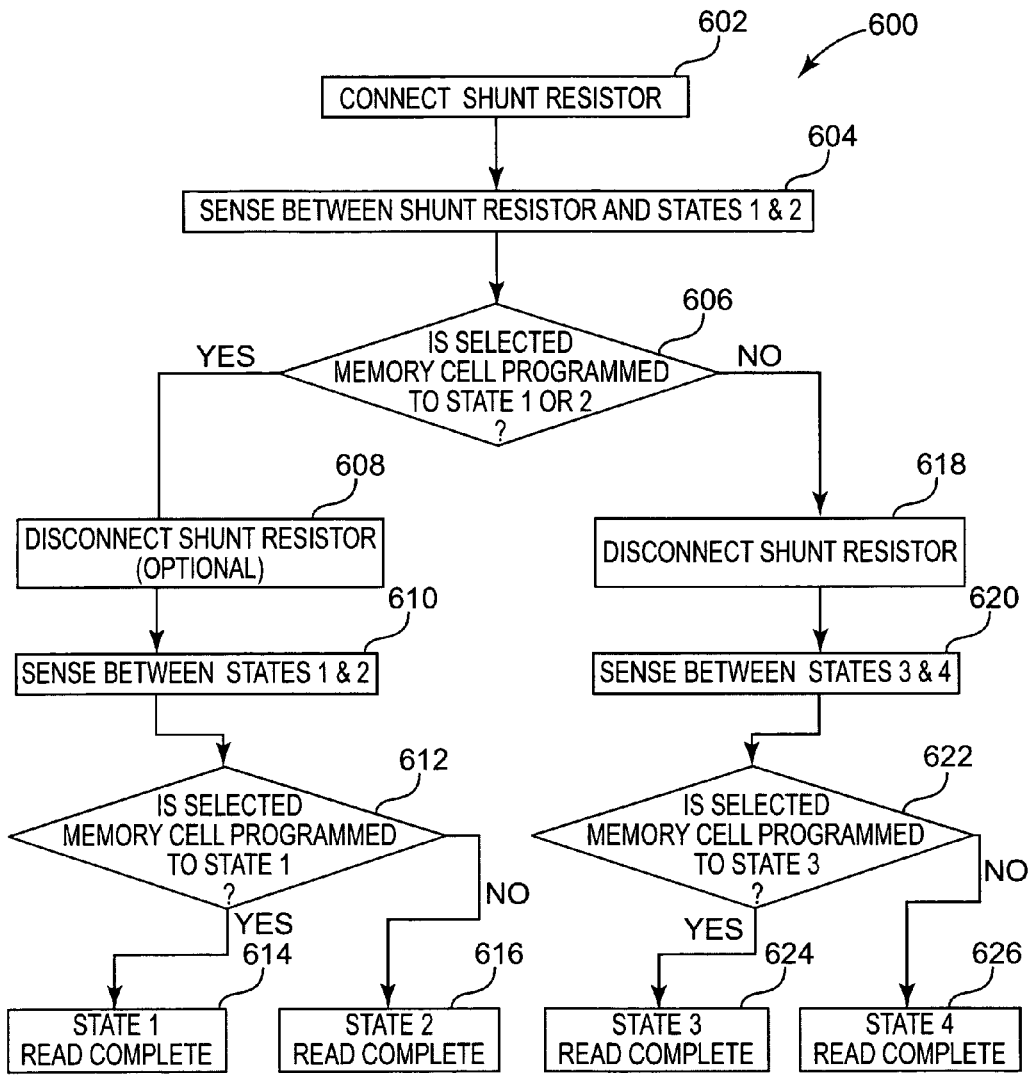
FIG. 7 is a flow diagram illustrating another embodiment of a method for reading a resistance state of a memory cell.

The following FIGS. 6A-7 illustrate another embodiment of a method for sensing the resistance state of a selected memory cell, such as memory cell 104a. The method uses a shunt circuit including a smaller number of shunt resistors than the method previously described and illustrated with reference to FIGS. 4A-5 and uses a smaller number of possible steps to obtain the resistance state of the selected memory cell. In this embodiment, each memory cell is programmed to one of four resistance states and each shunt circuit includes one shunt resistor. In other embodiments, each memory cell can be programmed to any suitable number of resistance states and each shunt circuit includes the suitable number of shunt resistors for determining the resistance state of each memory cell.

FIG. 6A is a chart 500a illustrating one embodiment of resistance distributions for memory cells and a first sensing level for a read operation. Chart 500a is similar to chart 300a previously described and illustrated with reference to FIG. 4A, except that in chart 500a the REF signal on REF signal path 130 (FIG. 3) is set at a value representing the resistance indicated at 502a between resistance distribution 308 and resistance distribution 310. A shunt resistor, such as shunt resistor 136a, is selected to provide the resistance indicated at 504a, which is greater than the resistance value represented by the REF signal at 502a and less than the lowest value of resistance distribution 310. Therefore, phase change elements having a resistance value above the shunt resistor value at 504a are protected from read disturb.

In response to a read signal, sense amplifier 118a (FIG. 3) compares the REF signal value 502a to the signal on bit line 112a to provide the OUT signal indicating whether the selected memory cell is programmed to one of the first and second resistance states or to one of the third and fourth resistance states. In one embodiment, if the voltage across the selected shunt resistor 136 is greater than a voltage on REF signal path 130, sense amplifier 118a outputs a logic high OUT signal on OUT signal path 132 indicating the selected memory cell is programmed to one of the third and fourth resistance states. In response to the voltage across the selected shunt resistor 136 being less than the voltage on REF signal path 130, sense amplifier 118a outputs a logic low OUT signal on OUT signal path 132 indicating the selected memory cell is programmed to one of the first and second resistance states. The read operation continues as illustrated in FIG. 6B.

FIG. 6B is a chart 500b illustrating one embodiment of resistance distributions for memory cells and two possible second sensing levels for a read operation. Chart 500b is similar to chart 500a previously described and illustrated with reference to FIG. 6A. In response to the OUT signal indicating the selected memory cell is programmed to one of the first and second resistance states, the REF signal on REF signal path 130 (FIG. 3) is set at a value representing the resistance indicated at 502b between resistance distribution 306 and resistance distribution 308. In addition, the shunt resistor having the resistance indicated at 504a (FIG. 6A) is optionally disconnected.

In response to a read signal, sense amplifier 118a (FIG. 3) compares the REF signal value 502b to the signal on bit line 112a to provide the OUT signal indicating whether the selected memory cell is programmed to the first resistance state or to the second resistance state. In one embodiment, if the voltage on bit line 112a is greater than a voltage on REF signal path 130, sense amplifier 118a outputs a logic high OUT signal on OUT signal path 132 indicating the selected memory cell is programmed to the second resistance state. In response to the voltage on bit line 112a being less than the voltage on REF signal path 130, sense amplifier 118a outputs a logic low OUT signal on OUT signal path 132 indicating the selected memory cell is programmed to the first resistance state. The read operation for the selected phase change memory cell is then complete.

In response to the OUT signal (from the FIG. 6A step) indicating the selected memory cell is programmed to one of the third and fourth resistance states, the REF signal on REF signal path 130 (FIG. 3) is set at a value representing the resistance indicated at 502c between resistance distribution 310 and resistance distribution 312. In addition, the shunt resistor having the resistance indicated at 504a (FIG. 6A) is disconnected.

In response to a read signal, sense amplifier 118a (FIG. 3) compares the REF signal value 502c to the signal on bit line 112a to provide the OUT signal indicating whether the selected memory cell is programmed to the third resistance state or to the fourth resistance state. In one embodiment, if the voltage on bit line 112a is greater than a voltage on REF signal path 130, sense amplifier 118a outputs a logic high OUT signal on OUT signal path 132 indicating the selected memory cell is programmed to the fourth resistance state. In response to the voltage on bit line 112a being less than the voltage on REF signal path 130, sense amplifier 118a outputs a logic low OUT signal on OUT signal path 132 indicating the selected memory cell is programmed to the third resistance state. The read operation for the selected phase change memory cell is then complete.

FIG. 7 is a flow diagram illustrating another embodiment of a method 600 for reading a selected phase change memory cell. At 602, a first shunt resistor such as a resistor having a resistance value as indicated at 504a in FIG. 6A is selectively coupled to the bit line of the selected memory cell. The first shunt resistor limits the current that can flow through the selected memory cell in response to a read signal. At 604, in response to a read signal, a signal indicating the resistance state of the selected memory cell is sensed. At 606, the signal indicating the resistance state of the selected memory cell is compared to a first reference value, such as reference value 502a illustrated in FIG. 6A.

If the signal indicating the resistance state of the selected memory cell is less than the reference value, the selected memory cell is determined to be programmed to one of the first and second resistance states and the shunt resistor is optionally disconnected at 608. At 610, in response to a read signal, a signal indicating the resistance state of the selected memory cell is sensed. At 612, the signal indicating the resistance state of the selected memory cell is compared to a second reference value, such as reference value 502b illustrated in FIG. 6B. If the signal indicating the resistance state of the selected memory cell is less than the reference value, the selected memory cell is determined to be programmed to the first resistance state and the read operation is complete as indicated at 614. If the signal indicating the resistance state of the selected memory cell is greater than the reference value, the selected memory cell is determined to be programmed to the second resistance state and the read operation is complete as indicated at 616.

If the signal indicating the resistance state of the selected memory cell is greater than or equal to the reference value at 606, the selected memory cell is determined to be programmed to one of the third and fourth resistance states and the shunt resistor is disconnected at 618. At 620, in response to a read signal, a signal indicating the resistance state of the selected memory cell is sensed. At 622, the signal indicating the resistance state of the selected memory cell is compared to a third reference value, such as reference value 502c illustrated in FIG. 6B. If the signal indicating the resistance state of the selected memory cell is less than the reference value, the selected memory cell is determined to be programmed to the third resistance state and the read operation is complete as indicated at 624. If the signal indicating the resistance state of the selected memory cell is greater than the reference value, the selected memory cell is determined to be programmed to the fourth resistance state and the read operation is complete as indicated at 626.

Method 600, while illustrated with reference to a memory cell storing two data bits, can be expanded for reading memory cells storing three or more data bits. Method 600 reduces the number of shunt resistors used and the possible number of steps of a read operation as compared to method 400 previously described and illustrated with reference to FIG. 5. For example, for a memory cell that stores four data bits (i.e., 16 possible resistive states), method 400 would use 15 shunt resistors and up to 15 compare steps while method 600 would use three shunt resistors and four compare steps.

Embodiments of the present invention provide an array of phase change memory cells including shunt circuits. The shunt circuits are centralized to bit lines or inputs of the sense amplifiers. Each shunt circuit includes one or more shunt resistors that are selectively coupled to the bit line of a selected memory cell during a read operation to protect the selected memory cell from read disturb.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a bit line;
   a plurality of resistive memory cells coupled to the bit line, each resistive memory cell programmable to each of at least two resistance states;
   a first resistor for selectively coupling to the bit line to form a first current divider with a selected memory cell during a read operation; and
   a second resistor for selectively coupling to the bit line to form a second current divider with the selected memory cell during a read operation in response to the resistance of the selected memory cell being greater than the resistance of the first resistor.

2. The integrated circuit of claim 1, wherein the resistive memory cells comprise phase change memory cells.

3. The integrated circuit of claim 1, wherein the first resistor comprises a linear resistor.

4. The integrated circuit of claim 1, wherein the first resistor comprises an active device acting as a resistor.

5. A memory comprising:
   a plurality of resistive memory cells, each resistive memory cell programmable to each of at least two resistance states; and
   a shunt circuit comprising at least a first shunt resistor for selectively coupling in parallel with the memory cells to form a first current divider with a selected memory cell and a second shunt resistor for selectively coupling in parallel with the memory cells to form a second current divider with the selected memory cell in response to a resistance of the selected memory cell being greater than a resistance of the first shunt resistor.

6. The memory of claim 5, wherein the memory cells comprise phase change memory cells.

7. The memory of claim 5, wherein the first shunt resistor comprises a linear resistor.

8. The memory of claim 5, wherein the first shunt resistor comprises an active device acting as a resistor.

9. The memory of claim 5, further comprising:
   a sense circuit for sensing a state of the selected memory cell based on a divided current signal through the shunt circuit and the selected memory cell.

10. The memory of claim 9, further comprising:
    a bit line coupled to the plurality of memory cells, the shunt circuit, and the sense circuit.

11. The memory of claim 9, wherein the sense circuit comprises a sense amplifier for sensing a state of the selected memory cell and the shunt circuit is coupled to an input of the sense amplifier.

12. A memory comprising:
a bit line;
a plurality of resistive memory cells coupled to the bit line, each resistive memory cell programmable to each of at least two resistance states; and
means for selectively shunting current from a selected memory cell during a read operation for sensing a resistance state of the selected memory cell,
wherein the means comprises a first resistor for selectively shunting current from the selected memory cell and a second resistor for selectively shunting current from the selected memory cell in response to the resistance of the selected memory cell being greater than the resistance of the first resistor.

13. The memory cell of claim 12, wherein the resistive memory cells comprise phase change memory cells.

14. The memory of claim 12, further comprising:
means for selectively electrically coupling the bit line to the means for shunting the current.

15. The memory of claim 13, further comprising:
means for sensing a state of the selected memory cell based on the shunted current.

16. The memory of claim 13, wherein each memory cell comprises at least one of Ge, Sb, Te, Ga, As, In, Se, and S.

17. A method for sensing a state of a resistive memory cell, the method comprising:
applying a first current to a bit line coupled to a selected memory cell;
shunting a first porti6n of the first current through a first resistor selectively coupled to the bit line;
sensing whether the selected memory cell is set at a first resistance state based on the shunted first portion of the first current;
shunting a second portion of the first current through a second resistor selectively coupled to the bit line in response to sensing the selected memory cell is not set at the first resistance state; and
sensing whether the selected memory cell is set at a second resistance state based on the shunted second portion of the first current.

18. The method of claim 17, wherein sensing the state of the resistive memory cell comprises sensing the state of a phase change memory cell.

19. The method of claim 17, further comprising:
sensing whether the selected memory cell is set at a third resistance state based on the shunted second portion of the first current.

20. The method of claim 17, further comprising:
shunting a third portion of the first current through a third resistor selectively coupled to the bit line in response to sensing the selected memory cell is not set at the second resistance state; and
sensing whether the selected memory cell is set at a third resistance state based on the shunted third portion of the first current.

21. The method of claim 20, further comprising:
sensing whether the selected memory cell is set at a fourth resistance state based on the shunted third portion of the first current.

22. A method for sensing a state of a resistive memory cell, the method comprising:
applying a first current to a bit line coupled to a selected memory cell set to one of at least four resistance states, the four resistance states including a first state having a first resistance, a second state having a second resistance greater than the first resistance, a third state having a third resistance greater than the second resistance, and a fourth state having a fourth resistance greater than the third resistance;
shunting a portion of the first current through a resistor selectively coupled to the bit line, a resistance of the resistor greater than the second resistance and less than the third resistance;
sensing whether the selected memory cell is set at a state having a resistance greater than the resistance of the resistor;
sensing the selected memory cell is set to one of the first state and the second state in response to sensing the selected memory cell is set at a state having a resistance less than the resistance of the resistor; and
decoupling the resistor from the bit line and sensing the selected memory cell is set to one of the third state and the fourth state in response to sensing the selected memory cell is set at a state having a resistance greater than the resistance of the resistor.

23. The method of claim 22, wherein sensing the state of the resistive memory cell comprises sensing the state of a phase change memory cell.

24. The method of claim 22, further comprising:
decoupling the resistor from the bit line in response to sensing the selected memory cell is set at a state having a resistance less than the resistance of the resistor.

* * * * *